United States Patent
Shaikh

(10) Patent No.: US 6,594,319 B1
(45) Date of Patent: Jul. 15, 2003

(54) APPARATUS AND METHOD FOR DETERMINING THE CLOSEST COSET POINTS IN A TRELLIS DECODER

(75) Inventor: Ali I. Shaikh, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/419,027

(22) Filed: Oct. 15, 1999

Related U.S. Application Data

(60) Provisional application No. 60/104,567, filed on Oct. 16, 1998.

(51) Int. Cl.$^7$ .............................. H04L 23/02; H04L 5/12
(52) U.S. Cl. ........................................ 375/265; 714/792
(58) Field of Search ................................. 375/265, 262, 375/341; 714/792, 794, 795, 791

(56) References Cited

U.S. PATENT DOCUMENTS

| | | | |
|---|---|---|---|
| 4,939,555 A | * 7/1990 | Calderbank et al. | ........ 375/286 |
| 4,980,897 A | 12/1990 | Decker et al. | |
| 5,301,209 A | 4/1994 | Wei | |
| 5,388,124 A | 2/1995 | Laroia et al. | |
| 5,519,731 A | 5/1996 | Cioffi | |
| 5,530,707 A | 6/1996 | Lin | |
| 5,583,889 A | 12/1996 | Citta et al. | |
| 5,594,742 A | * 1/1997 | Hemmati | .................... 714/792 |
| 5,604,772 A | 2/1997 | Botto et al. | |
| 5,661,734 A | 8/1997 | Lomp et al. | |
| 5,706,312 A | 1/1998 | Wei | |
| 5,774,500 A | 6/1998 | Zogakis et al. | |
| 5,914,988 A | * 6/1999 | Hu et al. | .................... 375/341 |

FOREIGN PATENT DOCUMENTS

EP 0680184 11/1995

OTHER PUBLICATIONS

"Trellis Subset Decoder Algorithm Based on a Pattern Recognition Scheme", *IBM Technical Disclosure Bulletin*, vol. 37, No. 10, Oct. 1994, pp. 693–697.

* cited by examiner

*Primary Examiner*—Jean Corrielus
(74) *Attorney, Agent, or Firm*—Samuels, Gauthier & Stevens, LLP

(57) ABSTRACT

A trellis decoder identifies the closest points from each coset in a four dimensional trellis decoder by reading a received point and determining upper and lower threshold values in a signal constellation to define a decode region within the constellation. The dimensions of the decode region are based on the number of bits of information in the received signal. The decoder translates the received point in four directions to provide four image points. Any imaged point that transitions outside the constellation decode region is mapped into the decode region to ensure that the four image points are within the decode region of the constellation. For each of the cosets, bit extraction is then performed to find the closest point to the received point. Once the closest coset points are identified, the trellis decoder performs a maximum likelihood sequence estimation using the Viterbi algorithm to determine the received sequence. Advantageously, the trellis decoder of the present invention provides a fast technique for determining the closest points to a received point from each coset.

8 Claims, 19 Drawing Sheets

| # OF BITS | ABSOLUTE MAXIMUM POSSIBLE | | DECODE BOUNDARY | | CORNER (LOWER) DECODE BOUNDARY | |
|---|---|---|---|---|---|---|
| | POSITIVE MAXIMUM | NEGATIVE MAXIMUM | POSITIVE MAXIMUM | NEGATIVE MAXIMUM | POSITIVE MAXIMUM | NEGATIVE MAXIMUM |
| 2 | 1.99 | -2 | 1.99 | -2 | N.A. | N.A. |
| 3 | 3.99 | -4 | 3.99 | -4 | 1.99 | -2 |
| 4 | 3.99 | -4 | 3.99 | -4 | N.A. | N.A. |
| 5 | 7.99 | -8 | 5.99 | -6 | 3.99 | -4 |
| 6 | 7.99 | -8 | 7.99 | -8 | N.A. | N.A. |
| 7 | 15.99 | -16 | 11.99 | -12 | 7.99 | -8 |
| 8 | 15.99 | -16 | 15.99 | -16 | N.A. | N.A. |
| 9 | 31.99 | -32 | 23.99 | -24 | 15.99 | -16 |
| 10 | 31.99 | -32 | 31.99 | -32 | N.A. | N.A. |
| 11 | 63.99 | -64 | 47.99 | -48 | 31.99 | -32 |
| 12 | 63.99 | -64 | 63.99 | -64 | N.A. | N.A. |
| 13 | 127.99 | -128 | 95.99 | -96 | 63.99 | -64 |
| 14 | 127.99 | -128 | 127.99 | -128 | N.A. | N.A. |
| 15 | 255.99 | -256 | 191.99 | -192 | 127.99 | -128 |

FIG. 5

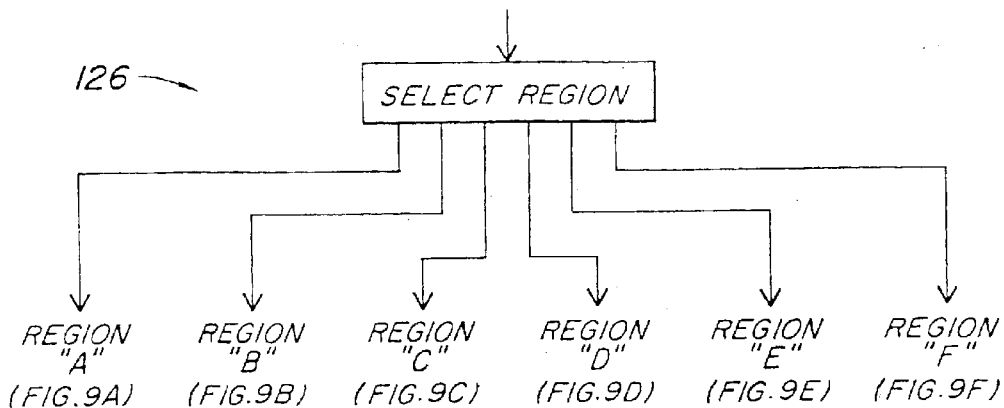

1 Region "A" points

Quadrant 1 "A" region, Y-coordinate of the point is pushed to Q1Y2.

Quadrant 2 "A" region, Y-coordinate of the point is pushed to Q2Y2.

Quadrant 3 "A" region, Y-coordinate of the point is pushed to Q3Y2.

Quadrant 4 "A" region, Y-coordinate of the point is pushed to Q4Y2.

2 Region "B" points

Quadrant 1 "B" region, Y-coordinate of the point is pushed to Q1Y2, X-coordinate of the point is pushed to Q1X1.

Quadrant 2 "B" region, Y-coordinate of the point is pushed to Q2Y2, X-coordinate of the point is pushed to Q2X1.

Quadrant 3 "B" region, Y-coordinate of the point is pushed to Q3Y2, X-coordinate of the point is pushed to Q3X1.

Quadrant 4 "B" region, Y-coordinate of the point is pushed to Q4Y2, X-coordinate of the point is pushed to Q4X1.

FIG. 9B

3 Region "C" points

3.1 Quadrant 1 region:

FIG. 9C

*3.1.1 point is on the 'clockwise' side of the absolute(X)=absolute(Y) line*

Y-coordinate of the point is pushed to Q1Y1, X-coordinate of the point is pushed to Q1X2.

*3.1.2 point is not on the 'clockwise' side of the absolute(X)=absolute(Y) line*

Y-coordinate of the point is pushed to Q1Y2, X-coordinate of the point is pushed to Q1X1.

3.2 Quadrant 2 region:

*3.2.1 point is on the 'clockwise' side of the absolute(X)=absolute(Y) line*

Y-coordinate of the point is pushed to Q2Y2, X-coordinate of the point is pushed to Q2X1.

*3.2.2 point is not on the 'clockwise' side of the absolute(X)=absolute(Y) line*

Y-coordinate of the point is pushed to Q2Y1, X-coordinate of the point is pushed to Q2X2.

3.3 Quadrant 3 region:

*3.3.1 point is on the 'clockwise' side of the absolute(X)=absolute(Y) line*

Y-coordinate of the point is pushed to Q3Y1, X-coordinate of the point is pushed to Q3X2.

*3.3.2 point is not on the 'clockwise' side of the absolute(X)=absolute(Y) line*

Y-coordinate of the point is pushed to Q3Y2, X-coordinate of the point is pushed to Q3X1.

3.4 Quadrant 4 region:

*3.4.1 point is on the 'clockwise' side of the absolute(X)=absolute(Y) line*

Y-coordinate of the point is pushed to Q4Y2, X-coordinate of the point is pushed to Q4X1.

*3.4.2 point is not on the 'clockwise' side of the absolute(X)=absolute(Y) line*

Y-coordinate of the point is pushed to Q4Y1, X-coordinate of the point is pushed to Q4X2.

4 Region "D" points

Quadrant 1 "D" region, Y-coordinate of the point is pushed to Q1Y1, X-coordinate of the point is pushed to Q1X2.

Quadrant 2 "D" region, Y-coordinate of the point is pushed to Q2Y1. X-coordinate of the point is pushed to Q2X2.

Quadrant 3 "D" region, Y-coordinate of the point is pushed to Q3Y1. X-coordinate of the point is pushed to Q3X2.

Quadrant 4 "D" region, Y-coordinate of the point is pushed to Q4Y1. X-coordinate of the point is pushed to Q4X2.

*FIG. 9D*

5 Region "E" points

Quadrant 1 "E" region, X-coordinate of the point is pushed to Q1X2.

Quadrant 2 "E" region, X-coordinate of the point is pushed to Q2X2.

Quadrant 3 "E" region, X-coordinate of the point is pushed to Q3X2.

Quadrant 4 "E" region, X-coordinate of the point is pushed to Q4X2.

*FIG. 9E*

6 Region "F" points

6.1 Quadrant 1 region

*6.1.1 point is on the 'clockwise' side of the absolute(X)=absolute(Y) line*

Y-coordinate of the point is pushed to Q1Y1.

*6.1.2 point is not on the 'clockwise' side of the absolute(X)=absolute(Y) line*

X-coordinate of the point is pushed to Q1X1.

6.2 Quadrant 2 region

*6.2.1 point is on the 'clockwise' side of the absolute(X)=absolute(Y) line*

X-coordinate of the point is pushed to Q2X1.

*6.2.2 point is not on the 'clockwise' side of the absolute(X)=absolute(Y) line*

Y-coordinate of the point is pushed to Q2Y1.

6.3 Quadrant 3 region

*6.3.1 point is on the 'clockwise' side of the absolute(X)=absolute(Y) line*

Y-coordinate of the point is pushed to Q3Y1.

*6.3.2 point is not on the 'clockwise' side of the aabsolute(X)=absolute(Y) line*

X-coordinate of the point is pushed to Q3X1.

6.4 Quadrant 4 region

*6.4.1 point is on the 'clockwise' side of the absolute(X)=absolute(Y) line*

X-coordinate of the point is pushed to Q4X1.

*2.2.6.4.2 point is not on the 'clockwise' side of the absolute(X)=absolute(Y) line*

Y-coordinate of the point is pushed to Q4Y1.

*FIG. 9F*

| 1 3 bit constellation coset0 point: | 2 3 bit constellation coset1 point: |
|---|---|
| *1.1 X greater than or equal to '-1'* | *2.1 Y greater than or equal to '+1'* |
| closest point is '0 0 0' | closest point is '1 0 1' |
| *1.2 X less than '-1'* | *2.2 Y less than '+1'* |
| closest point is '1 0 0' | closest point is '0 0 1' |

| 3 3 bit constellation coset2 point: | 4 3 bit constellation coset3 point: |
|---|---|
| *3.1 Y greater than or equal to '-1'* | *4.1 X greater than or equal to '+1'* |
| closest point is '0 1 0' | closest point is '1 1 1' |
| *3.2 Y less than '-1'* | *4.2 X less than '+1'* |
| closest point is '1 1 0' | closest point is '0 1 1' |

5 5 bit constellation coset0 point:

5.1 (X<-1 & Y<-1)

closest point is '0 1 1 0 0'

5.2 (X<-1 & Y>=-1 & Y<3)

closest point is '0 1 0 0 0'

5.3 (X<-1 & Y>=3)

closest point is '1 1 0 0 0'

5.4 (X>=-1 & X<3 & Y<-1)

closest point is '0 0 1 0 0'

5.5 (X>=-1 & X<3 & Y>=-1 & Y<3)

closest point is '0 0 0 0 0'

5.6 (X>=-1 & X<3 & Y>=3)

closest point is '1 0 1 0 0'

5.7 (X>=3 & Y<-1)

closest point is '1 1 1 0 0'

5.8 (X>=3 & Y>=-1 & Y<3)

closest point is '1 0 0 0 0'

5.9 (X>=3 & Y>=3 & abs(X)>=abs(Y))

closest point is '1 0 0 0 0'

5.10 (X>=3 & Y>=3 & abs(X)<abs(Y))

closest point is '1 0 1 0 0'

FIG. 11A 6 5 bit constellation coset1 point:

6.1 (X<-1 & Y<-3)

closest point is '1 1 1 0 1'

6.2 (X<-1 & Y>=-3 & Y<1)

closest point is '0 1 1 0 1'

6.3 (X<-1 & Y>=1)

closest point is '0 1 0 0 1'

6.4 (X>=-1 & X<3 & Y<-3)

closest point is '1 0 1 0 1'

6.5 (X>=-1 & X<3 & Y>=-3 & Y<1)

closest point is '0 0 1 0 1'

6.6 (X>=-1 & X<3 & Y>=1)

closest point is '0 0 0 0 1'

6.7 (X>=3 & Y<-1 & Y>=-3)

closest point is '1 1 1 0 1'

6.8 (X>=3 & Y>=1)

closest point is '1 0 0 0 1'

6.9 (X>=3 & Y<-1 & abs(X)>=abs(Y))

closest point is '1 1 1 0 1'

6.10 (X>=3 & Y<-1 & abs(X)<abs(Y))

closest point is '1 0 1 0 1'

FIG. 11B 7 5 bit constellation coset2 point:

7.1 (X<-3 & Y<-1)

closest point is '1 1 1 1 0'

7.2 (X<-3 & Y>=-1 & Y<3)

closest point is '1 0 0 1 0'

7.3 (X>-3 & X<1 & Y<-1)

closest point is '0 1 1 1 0'

7.4 (X>=-3 & X<1 & Y>=-1 & Y<3)

closest point is '0 1 0 1 0'

7.5 (X>=-3 & X<1 & Y>=3)

closest point is '1 1 0 1 0'

7.6 (X>=1 & Y<-1)

closest point is ' 0 0 1 1 0'

7.7 (X>=1 & Y>=-1 & Y<3)

closest point is '0 0 0 1 0'

7.8 (X>=1 & Y>=3)

closest point is '1 0 1 1 0'

7.9 (X<-3 & Y>=3 & abs(X)>=abs(Y))

closest point is '1 0 0 1 0'

7.10 (X<-3 & Y>=3 & abs(X)<abs(Y))

closest point is '1 1 0 1 0'

FIG. 11C 8 5 bit constellation coset3 point:

8.1 (X<-3 & Y<-3 & abs(X)>=abs(Y))

closest point is '1 1 1 1 1'

8.2 (X<-3 & Y<-3 & abs(X)<abs(Y))

closest point is '1 1 0 1 1'

8.3 (X<-3 & Y>=-3 & Y<1)

closest point is '1 1 1 1 1'

8.4 (X<-3 & Y>=1)

closest point is '1 0 0 1 1'

8.5 (X>=-3 & X<1 & Y<-3)

closest point is '1 1 0 1 1'

8.6 (X>=-3 & X<1 & Y>=-3 & Y<1)

closest point is ' 0 1 1 1 1'

8.7 (X>=-3 & X<1 & Y>=1)

closest point is '0 1 0 1 1'

8.8 (X>=1 & Y<-3)

closest point is '1 0 1 1 1'

8.9 (X>=1 & Y>=-3 & Y<1)

closest point is '0 0 1 1 1'

8.10 (X>=1 & Y>=1)

closest point is '0 0 0 1 1'

FIG. 11D

TABLE 15 - DETERMINING THE TOP 2 BITS OF X AND Y

| $v_{b-1}, v_{b-2}, \ldots, v_{b-5}$ | $X_c, X_{c-1}$ | $Y_c, Y_{c-1}$ |
|---|---|---|
| 0 0 0 0 0 | 0 0 | 0 0 |
| 0 0 0 0 1 | 0 0 | 0 0 |
| 0 0 0 1 0 | 0 0 | 0 0 |
| 0 0 0 1 1 | 0 0 | 0 0 |
| 0 0 1 0 0 | 0 0 | 1 1 |
| 0 0 1 0 1 | 0 0 | 1 1 |
| 0 0 1 1 0 | 0 0 | 1 1 |
| 0 0 1 1 1 | 0 0 | 1 1 |
| 0 1 0 0 0 | 1 1 | 0 0 |
| 0 1 0 0 1 | 1 1 | 0 0 |
| 0 1 0 1 0 | 1 1 | 0 0 |
| 0 1 0 1 1 | 1 1 | 0 0 |
| 0 1 1 0 0 | 1 1 | 1 1 |
| 0 1 1 0 1 | 1 1 | 1 1 |
| 0 1 1 1 0 | 1 1 | 1 1 |
| 0 1 1 1 1 | 1 1 | 1 1 |
| 1 0 0 0 0 | 0 1 | 0 0 |
| 1 0 0 0 1 | 0 1 | 0 0 |
| 1 0 0 1 0 | 1 0 | 0 0 |
| 1 0 0 1 1 | 1 0 | 0 0 |
| 1 0 1 0 0 | 0 0 | 0 1 |
| 1 0 1 0 1 | 0 0 | 1 0 |
| 1 0 1 1 0 | 0 0 | 0 1 |
| 1 0 1 1 1 | 0 0 | 1 0 |
| 1 1 0 0 0 | 1 1 | 0 1 |
| 1 1 0 0 1 | 1 1 | 1 0 |
| 1 1 0 1 0 | 1 1 | 0 1 |
| 1 1 0 1 1 | 1 1 | 1 0 |
| 1 1 1 0 0 | 0 1 | 1 1 |
| 1 1 1 0 1 | 0 1 | 1 1 |
| 1 1 1 1 0 | 1 0 | 1 1 |
| 1 1 1 1 1 | 1 0 | 1 1 |

*FIG. 13*

APPARATUS AND METHOD FOR DETERMINING THE CLOSEST COSET POINTS IN A TRELLIS DECODER

CROSS REFERENCE TO RELATED APPLICATIONS

This application claims priority from the provisional application designated Ser. No. 60/104,567, filed Oct. 16, 1998 and entitled "Finding Closest Points in Four Dimensional Trellis Code Decoding". This application is hereby incorporated by reference.

BACKGROUND OF THE INVENTION

The present invention relates to communications, and in particular to a trellis decoder.

Broadband modems, and in particular asymmetric digital subscriber line (ADSL) modems dramatically increase the ability to transfer data over conventional telephone lines. Significantly, ADSL modems allow data transfers at rates over two hundred times faster than conventional modems, and over ninety times faster than ISDN lines.

The bandwidth of a conventional copper twisted pair telephone line is approximately 1 MHz. However, conventional analog signals that carry voice over these lines operate in a bandwidth that is only 4 kHz wide. Advantageously, ADSL takes advantage of the remaining portion of the 1 MHz. Specifically, ADSL technology effectively subdivides the 1 MHz bandwidth of the copper twisted pair line into three information channels: i) a high speed down stream channel, ii) a medium speed duplex (upstream/downstream) channel, and iii) a conventional voice channel. Downstream refers to transmissions from the telephone network to the ADSL modem located at a subscriber site, while upstream is the route from the subscriber site to the telephone network. This multichannel approach enables subscribers to access the internet, order a video for viewing and send a facsimile or talk on the telephone all at the same time.

To ensure commonality of the various ADSL modems that will be deployed and the telephone central office (CO), industry has been working with the American National Standards Institute, Inc. to establish a standard for the interface between the ADSL modems and the telephone CO. This standard is designated T1.413 and entitled "Interface Between Networks and Customer Installation—Asymmetric Digital Subscriber Line (ADSL) Metallic Interface". The standard specifies that the transmission encoders use constellation encoding. One type of constellation encoding is trellis encoding.

U.S. Pat. No. 4,980,897 entitled "Multi-Channel Trellis Encoder/Decoder" (hereinafter "the '897 Patent") discloses a trellis encode/decoder. As shown in FIG. 11 of the '897 Patent, the decode process includes the steps of initializing the decoder to a known state and then reading the received signal ($X_n$, $Y_n$) from the receive vector buffer. Next, the nearest points from each coset are determined. The decoding process than performs maximum likelihood sequence estimation using the Viterbi algorithm.

The '897 Patent discloses that the step of determining the closest coset points to the received point involves computing the Euclidean distance between each point in the constellation and the received point, and then comparing the distances. Significantly, as the number of bits in a received point signal increases, so does the number of points in the constellation, and thus the number of computations and comparisons that must be performed to determine the closest coset points. That is, as disclosed in the '897 Patent each point in the constellation has to be compared to the received point, and thus the number of computations and comparisons is rather large. For example, if the signal has N bits, then $2^N-1$ comparisons are required (e.g., if N=15 then 32,767 comparisons are required). U.S. Pat. Nos. 5,301,209; 5,706,312; 5,519,731 and 5,530,707 also disclose various aspects of trellis encoding and decoding.

Therefore, there is a need to quickly and efficiently determine the closest coset points to the received point in the trellis decoder.

SUMMARY OF THE INVENTION

An object of the present invention is to efficiently identify the closest coset points to a received point in a trellis decoder.

Briefly, according to the present invention, a trellis decoder identifies the closest points for each coset in a trellis decoder by reading a received point and determining upper and lower threshold values in a signal constellation to define a decode region within the constellation. The dimensions of the decode region are based on the number of bits of information in the received signal. For a four dimensional trellis code, the decoder translates the received point in four directions to provide four image points. Any image points that would be outside the constellation decode region are mapped into the decode region to ensure that the four image points are within the decode region of the constellation. For each of the cosets, bit extraction is then performed to find the closest point to the received point.

Once the closest coset points are identified, the trellis decoder performs a maximum likelihood sequence estimation using the Viterbi algorithm to determine the received sequence.

Advantageously, the trellis decoder of the present invention provides a fast technique for determining the closest points to a received point for each coset. The decoder is preferably implemented as a state machine. However, the present invention may also be incorporated in a central processing unit having sufficient processing speed to support the communications that employs the trellis decoder.

These and other objects, features and advantages of the present invention will become apparent in light of the following detailed description of preferred embodiments thereof, as illustrated in the accompanying drawings.

BRIEF DESCRIPTION OF THE DRAWINGS

FIG. 5 illustrates a look-up table that defines the signaling constellation size and a signal decode region within the constellation based on the number of bits in the received signal;

FIGS. 9A–9C together illustrate steps for pushing translated/imaged points outside the decode region into the decode region;

DETAILED DESCRIPTION OF THE INVENTION

The present invention shall be discussed in the context of use in a modem. However, one of ordinary skill will appreciate that decoder of the present invention is not limited to use in a modem. Indeed, the decoder may be used in virtually any communications system employing a trellis decoder.

Figure 1:
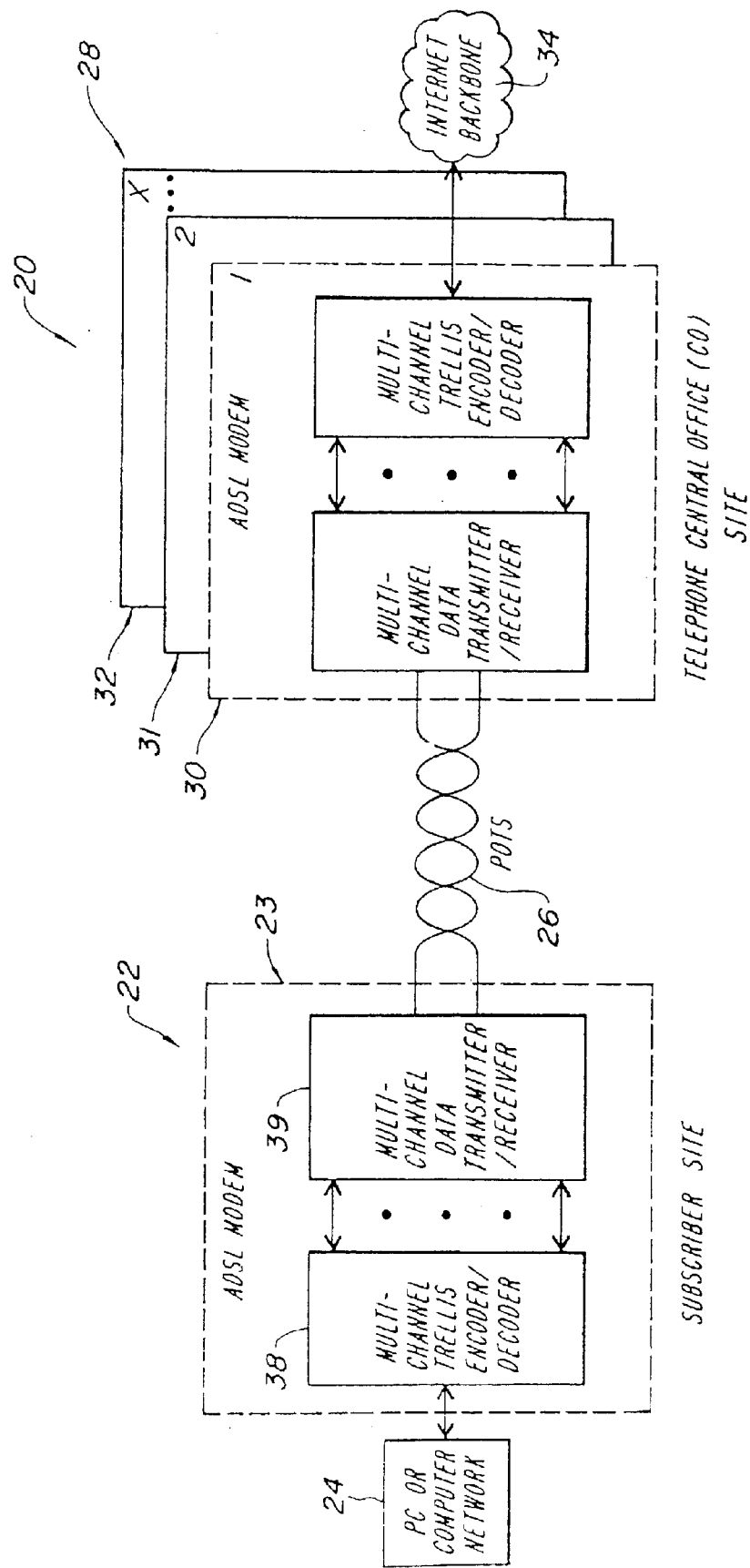
FIG. 1 illustrates a functional block diagram of a communications system.

FIG. 1 illustrates a functional block diagram of a communications system 20. The system 20 includes a subscriber site 22 comprising a broadband modem 23 (e.g., an asymmetric digital subscriber line (ADSL) modem) that connects a personal computer (PC), or a server 24 to a plain old telephone (POTs) line 26. The PC 24 communicates via the modem 23 over the POTs line 26 with the telephone central office (CO) 28. The telephone CO 28 also includes a plurality of broadband modems 30–32 (e.g., ADSL modems) that connect subscriber sites to the CO in order to route telephone calls and provide subscriber access to an Internet backbone 34.

The modem 23 includes a multi-channel trellis encoder/decoder 38 and a transceiver 39. The modems 30–32 in the CO are structurally similar. In the interest of brevity, the known principles of trellis coding shall not be repeated herein. A general explanation of trellis encoding/decoding is set forth in U.S. Pat. No. 4,980,897 entitled "Multi-Channel Trellis Encoder/Decoder", which is hereby incorporated by reference.

The encoder/decoders are preferably compatible with industry standard specification designated T1.413 and entitled "Interface Between Networks and Customer Installation Asymmetric Digital Subscriber Line (ADSL) Metallic Interface" (hereinafter the "T1.413 Specification"which is also hereby incorporated by reference. This standard specifies that the transmission encoders use constellation encoding, one type of which is trellis encoding.

Figure 2:
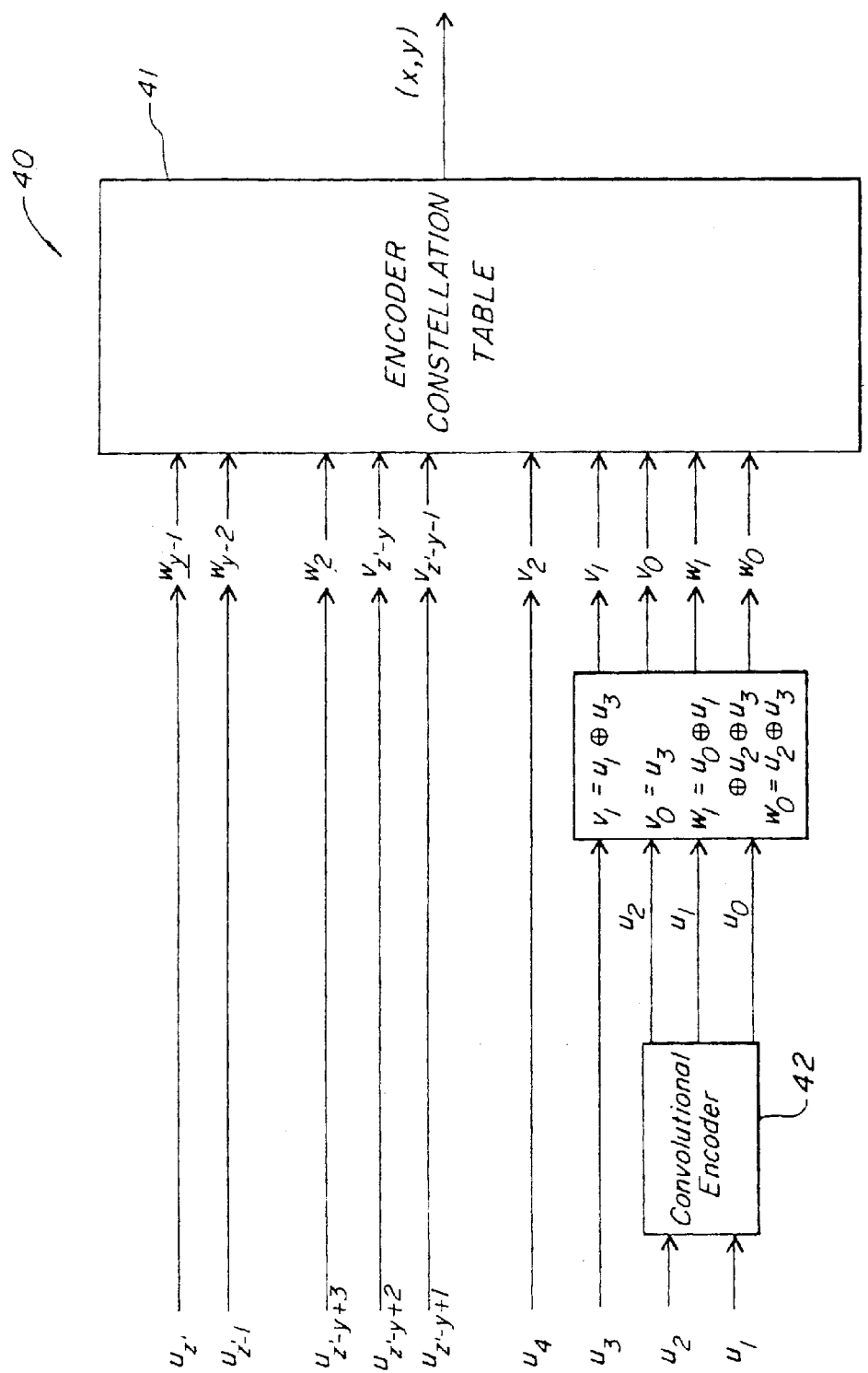
FIG. 2 illustrates a finite-state encoder.

FIG. 2 illustrates a finite-state encoder 40, resident in the multi-channel trellis encoder/decoder 38. The finite-state encoder 40 is essentially the same as the one illustrated in FIG. 16 of the T1.413 Specification. The finite-state encoder receives a binary input signal U and generates vectors V and W, which are used to look-up a constellation point (X,Y) in encoder constellation table 41. The encoder 40 also includes a convolutional encoder 42 that employs a ⅔ rate code. A preferred embodiment of the convolution encoder 41 is shown in FIG. 17 of the T1.413 Specification. The constellation point (X,Y) is processed by the multi-channel data transceiver 39 (FIG. 1) and transmitted over the channel (e.g., a POTs line) to the receiver site.

Figure 3:
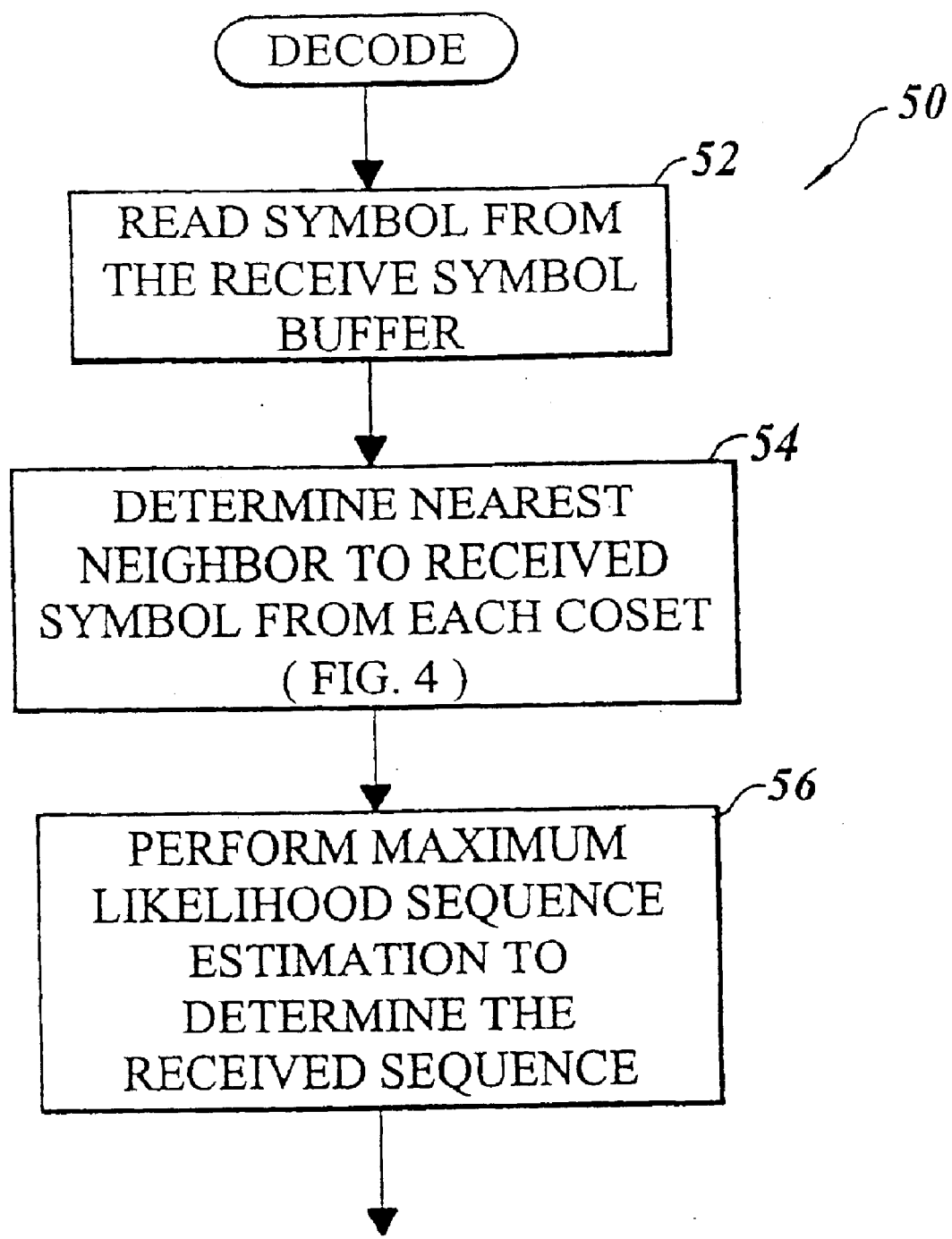
FIGS. 3–4 are flowchart illustrations of the received signal processing for a trellis decoder.

FIG. 3 is a flow chart illustration of a symbol decoding process 50 performed by the multi-channel trellis decoders. These steps are preferably preformed by dedicated hardware located on an integrated circuit. For example, the hardware may include a finite state machine. Alternatively, these steps may be preformed by at least one central processing unit (CPU) located on an integrated circuit.

The symbol decoding process 50 includes a step 52 to read a received symbol (i.e., the vector) $(X_n, Y_n)$ from the received symbol buffer (not shown). The subscript "n" is used to differentiate the received signal from the transmitted signal due to the presence of noise on the received signal. The received symbol buffer may be located in the transceiver 39 (FIG. 1). Step 54 is then preformed to determine the nearest neighbor of the received symbol from each coset. That is, if there are four cosets, step 54 identifies four constellation points, one from each coset that are closest to the received symbol. Once the nearest constellation point from each coset are identified by step 54, maximum likelihood sequence estimation is then preformed in step 56 to determine the received sequence.

Figure 4:
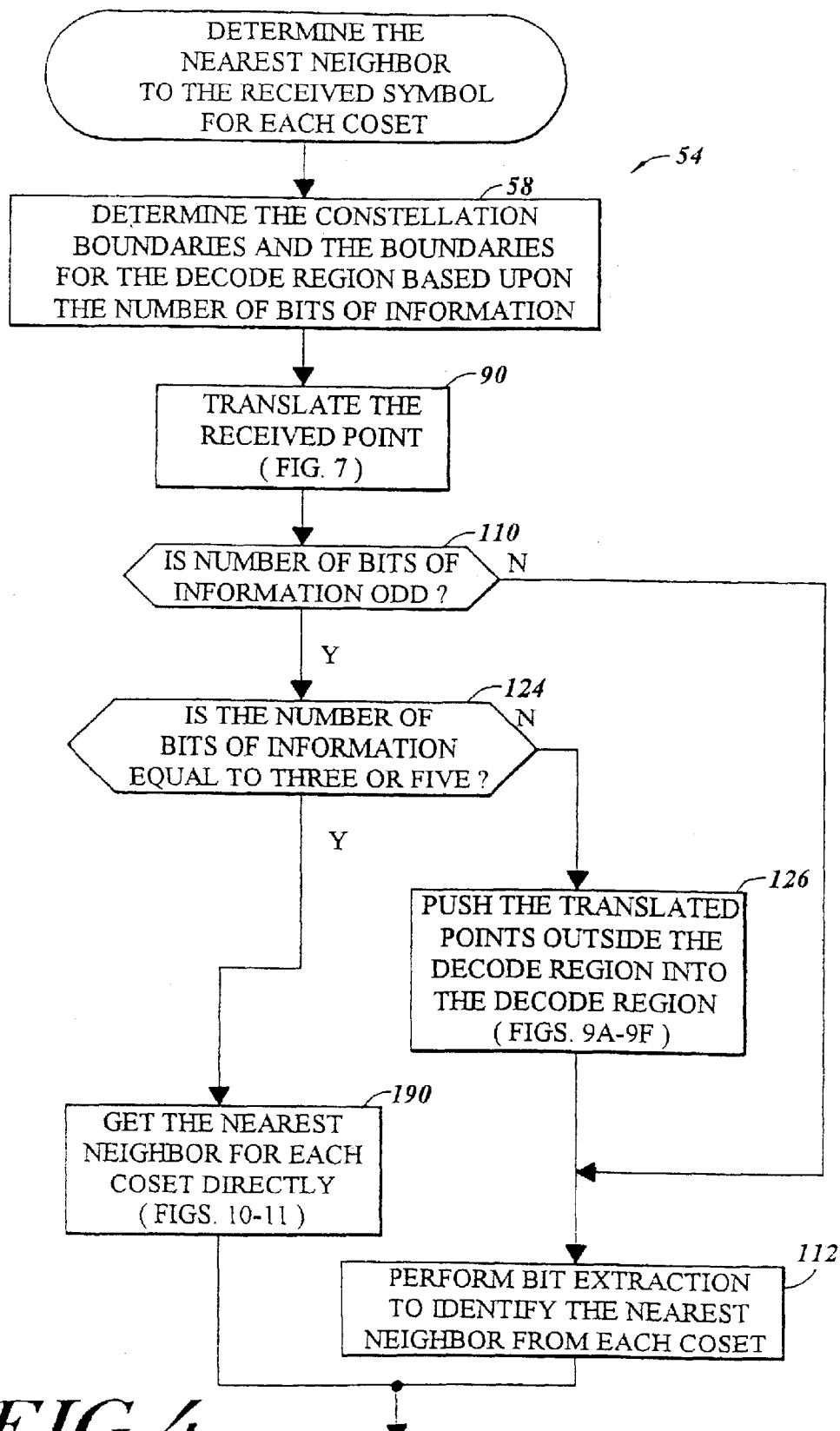

FIG. 4 illustrates a more detailed series of steps involved in the step 54 of determining the nearest neighbor to the received symbol from each coset, according to the present invention. Step 58 is performed to determine the constellation boundaries and boundaries for a decode region based upon the number of bits of information. FIG. 5 illustrates a receiver look-up table 60 that defines the constellation limits based upon the number of bits used to define the received symbol/vector. FIG. 5 also identifies the boundaries that define the decode region within the constellation limits. The number of information bits are listed down the first column 62, and the maximum upper and lower limits of the constellation are defined by columns 64, 66 of the table, respectively. The boundaries of the decode region are identified in columns 68, 70.

Figure 6:
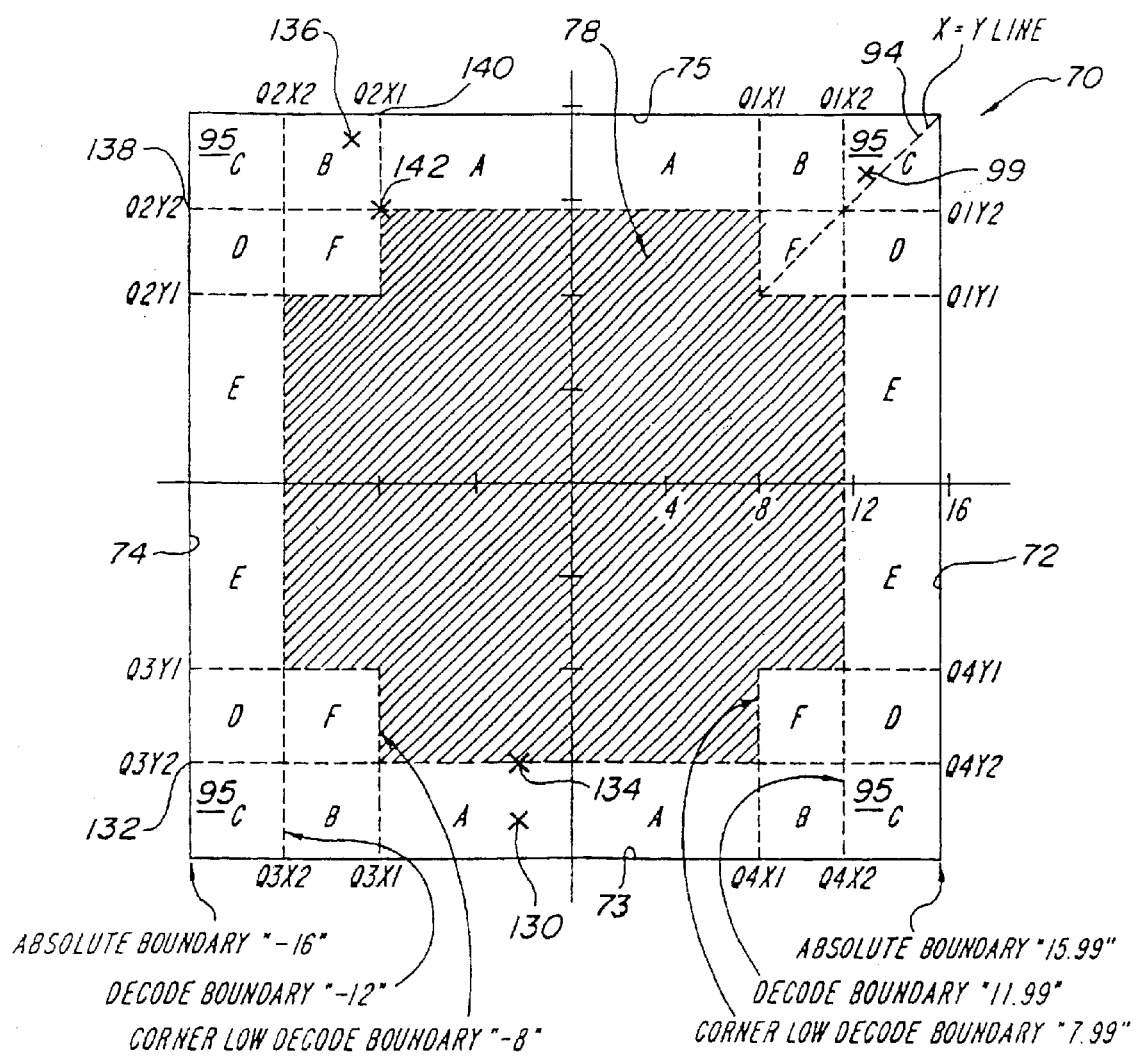
FIG. 6 is a graphic representation of the boundaries for a symbol constellation defined by seven bits.

FIG. 6 is a graphic representation 70 of the boundaries for a symbol defined by seven bits. Lines 72–75 define the maximum possible symbol value based upon seven bits. Referring to FIGS. 5 and 6, for a symbol having seven bits as shown in column 62, the boundary values defined by lines 72–75 are identified in columns 64, 66 of the table 60. Specifically, for seven bits the maximum value is 15.99 and the minimum value is −16. Within these boundaries is a decode region 78 whose boundaries are defined in columns 68, 70 of the table 60. For example, for seven bits the non-rectangular decode region 78 has a maximum value of 11.99 and a minimum value −12. The decode region 78 is graphically illustrated shown in FIG. 6 as shaded decode region 78. The shaded decode region 78 represents the area of the constellation within which the received signal may properly be located. Columns 80, 82 define the boundaries of the non-rectangular decode region corners. Only the symbols defined by an odd number of bits have non-rectangular decode regions.

Figure 7:
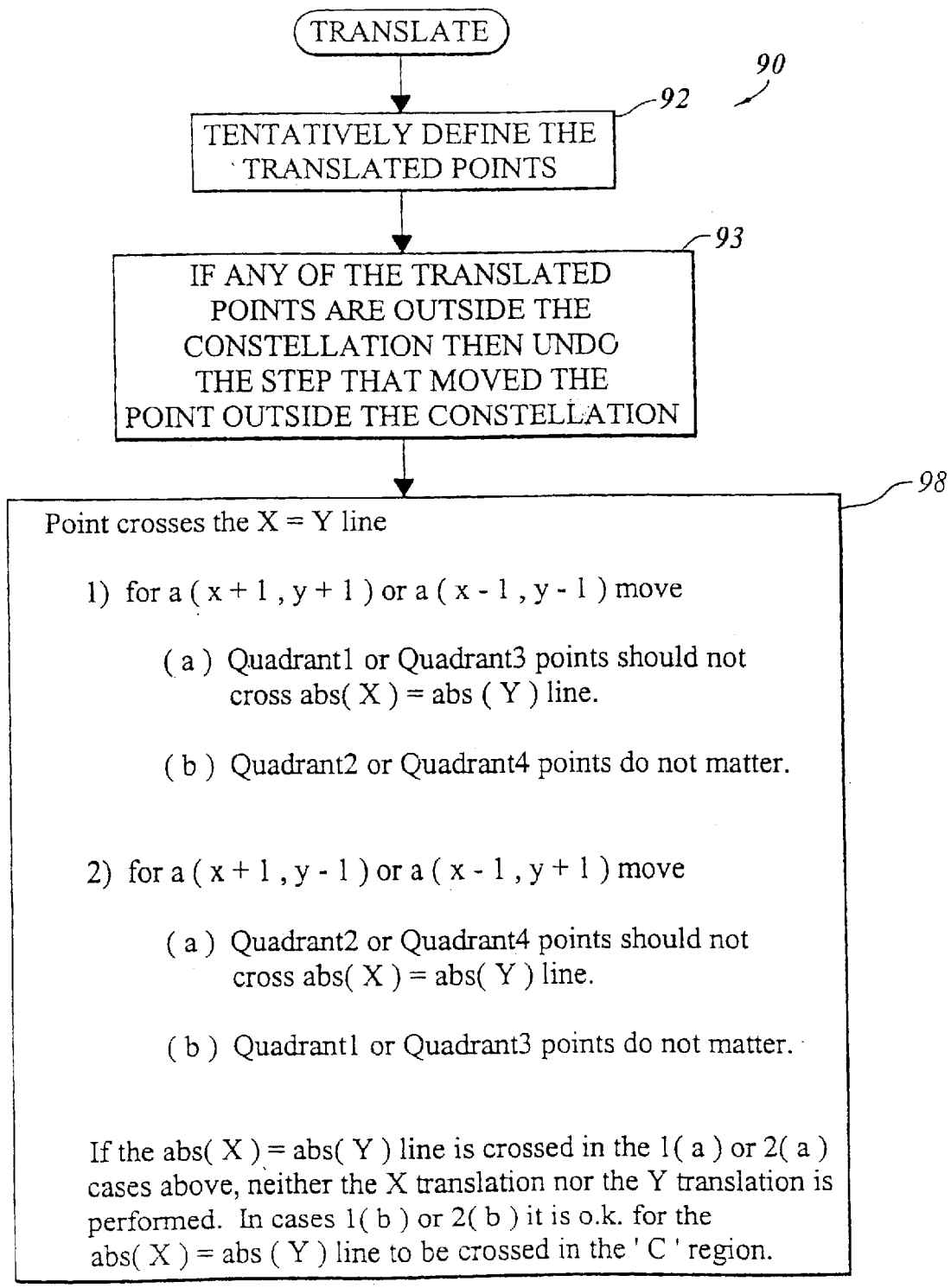
FIG. 7 is a flowchart illustration of a series of steps for translating a received point.

Referring again to FIG. 4, following the determination of the decode region boundaries in step 58, step 90 is performed to translate the received point into a plurality of image points. FIG. 7 illustrates a series of steps for performing the translation step 90. Specifically, the translation step 90 comprises step 92, which is performed to define four translated image points that are based upon the received point $(X_n, Y_n)$. The four imaged points are initially/tentatively defined as $(X_n+1, Y_n+1)$, $(X_n-1, Y_n+1)$, $(X_n-1, Y_n-1)$ and $(X_n+1, Y_n-1)$ subject to several translation constraints that shall now be discussed.

Step 93 is then performed to determined if the step of adding or subtracting a binary one from either of the indices values causes the resultant point to wrap around to the other side of the constellation due to the fixed bit length of the point. For example, if the X (Y) index (i.e., coordinate) value of the signal is 0111111111111111(binary), then adding a binary one to the value results in a sum of 1000000000000000 (binary), which is a negative value, and hence the resultant value would wrap around from the right (top) of the constellation to the left (bottom). If the point wraps around the constellation, then the subtraction or addition to the X index value which causes the point to wrap around is not performed. For example, the X index value for the imaged point would remain at 0111111111111111 (binary) (i.e., the imaged point would have an X index value equal to $X_n$). Similarly, the subtraction or addition to the Y index value is checked to determine if the step would cause the point to wrap around, and if it would then subtraction or additional step is not performed. The X and Y index values are tested independently. In a hardware implementation (e.g., a state machine), this test can be performed by checking the sign changes after the addition/subtraction in step 92, and if it does change the sign the addition/subtraction is not performed.

Referring to FIGS. 6 and 7, for received points located in "C" region 95 of the constellation, the translation step 90 also performs a step 98 to determine if the translation would cause the image point to cross "X=Y" line 94. For example, referring to FIG. 6, if the received point $(X_n, Y_n)$ is at location 99, then the translation to $(X_n+1, Y_n+1)$ may cause the resultant point to cross the line 94. If it would, then neither the X nor the Y-direction translation is performed. As a result, the imaged point will be equal to the received point $(X_n, Y_n)$. The translations in the other three directions would be performed as normal, subject to the constraint in step 93 for preventing translations that change the sign of the index value.

Following step 98 we have four translated/imaged points (although one or more of the imaged points may actually be equal to the received point due to the translation constraints of steps 93 and 98).

Figure 8:
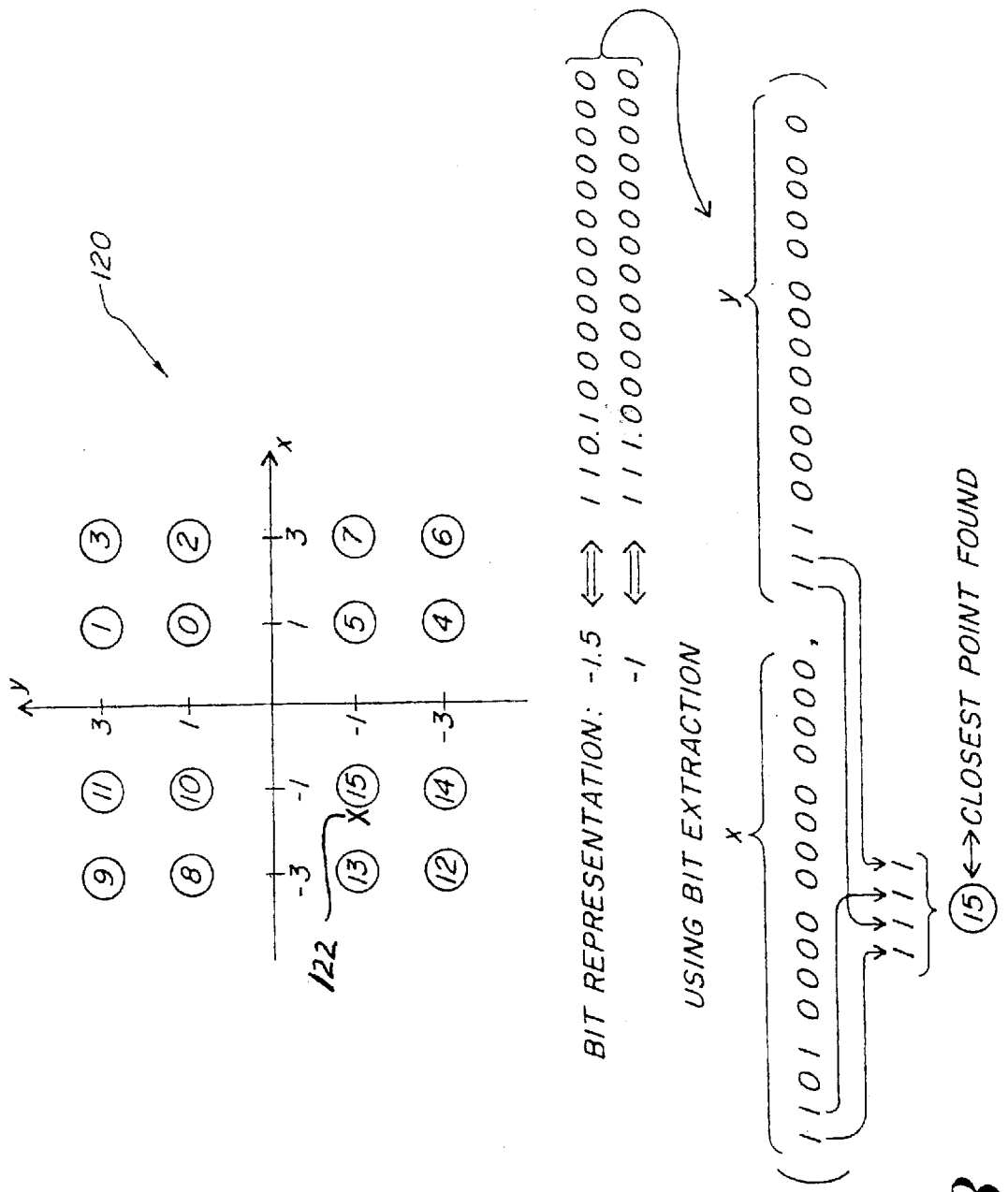
FIG. 8 is a pictorial illustration of a four bit constellation and bit processing associated with the step of bit extraction.

Referring again to FIG. 4, once the translation step 90 is complete, the next series of steps in the decode process depend upon the number of bits of information used to define a received point. Step 110 determines if the number of bits is odd or even. If it is an even number, then step 112 performs bit extraction to determine the closet cosets. For example, referring to FIG. 8 that illustrates a four bit constellation 120, if one of the imaged points is at location (−1.5, −1) 122, then bit extraction determines that the closest coset point is point fifteen as shown in FIG. 8. As shown in one embodiment, the X and Y indices are each represented by sixteen bits. It should be noted that a push step is not required for even number bits of information.

Referring yet again to FIG. 4, if the constellation is defined by an odd number of bits, then step 124 is performed to determine if that odd number is equal to either three or five. If it is not (e.g., the constellation is defined by seven bits) then step 126 is performed to "push" any of the imaged points that lie outside the decode region into the decode region. Referring to FIGS. 4 and 6, all the coset points for the seven bit constellation must lie in the shaded decode region 78. Therefore, step 126 analyzes each of the imaged points, and "pushes" any of the imaged points that lie outside the shaded decode region 78 into the decode region. For example, if one of the imaged points is located at position 130, which is in quadrant 3, then the imaged point is shifted/pushed in the Y-direction onto line Q3Y2 132, thus relocating that imaged point to location 134. Similarly, if a imaged point is at location 136, the step 126 (FIG. 4) pushes the imaged point in the Y-direction to line Q2Y2 138, and in the X-direction to line Q2X1 140. As a result the imaged point is relocated/pushed to location 142, and is now located in the shaded decode region 78.

FIGS. 9A–9C together define each of the specific "push" operations required for points that lie outside the shaded decode region 78 (FIG. 6). The operations are separated based upon the region that the image point lies in, and the quadrant within the region. The regions are associated with the regions A, B, C, D, E and F shown in FIG. 6. Step 126 (FIG. 4) implements the translations identified in FIGS. 9A–9C.

Figure 11:
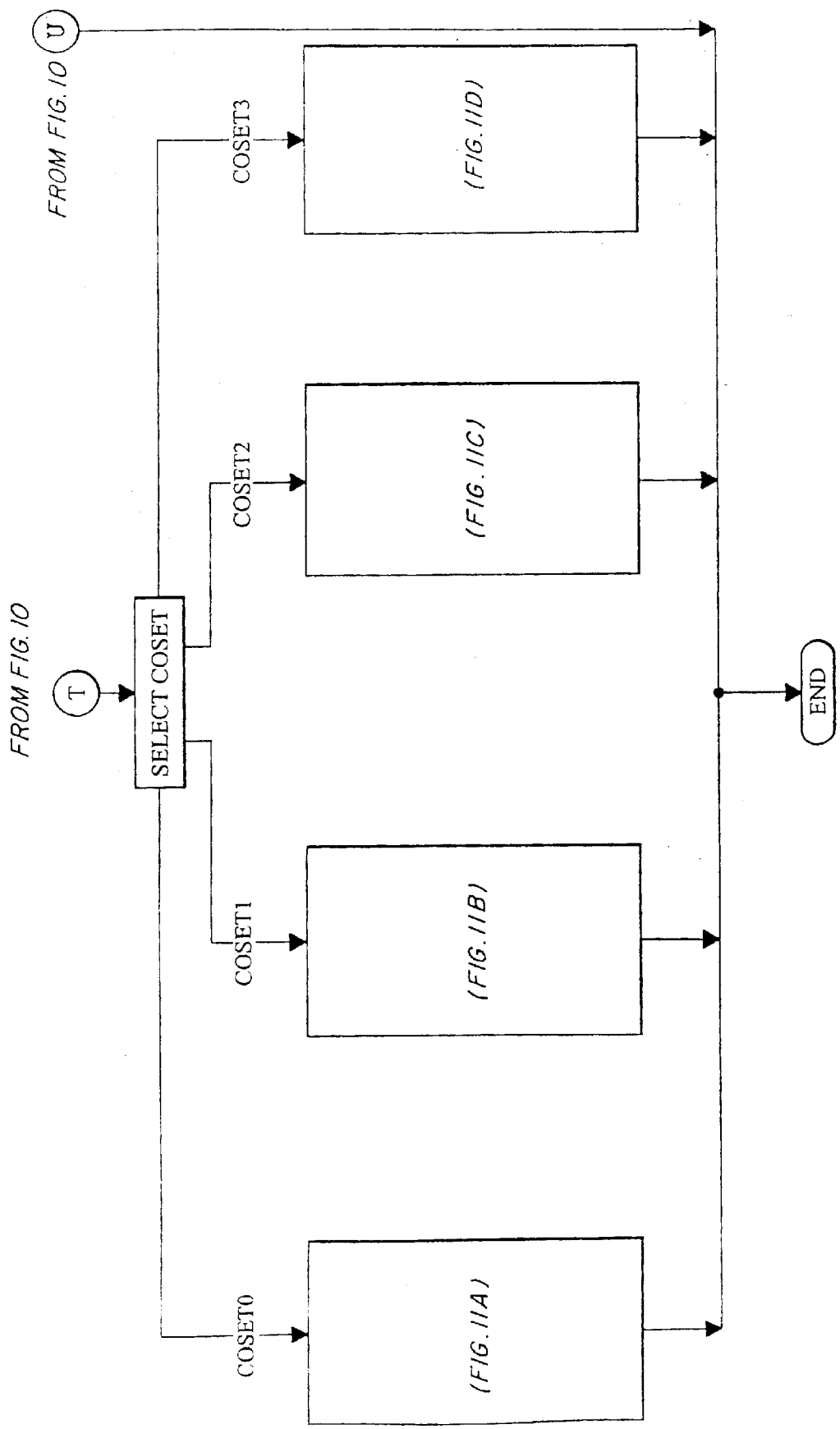
FIG. 11 is a pictorial illustration of a five bit constellation and bit processing associated with the step of bit extraction.
Figure 12:
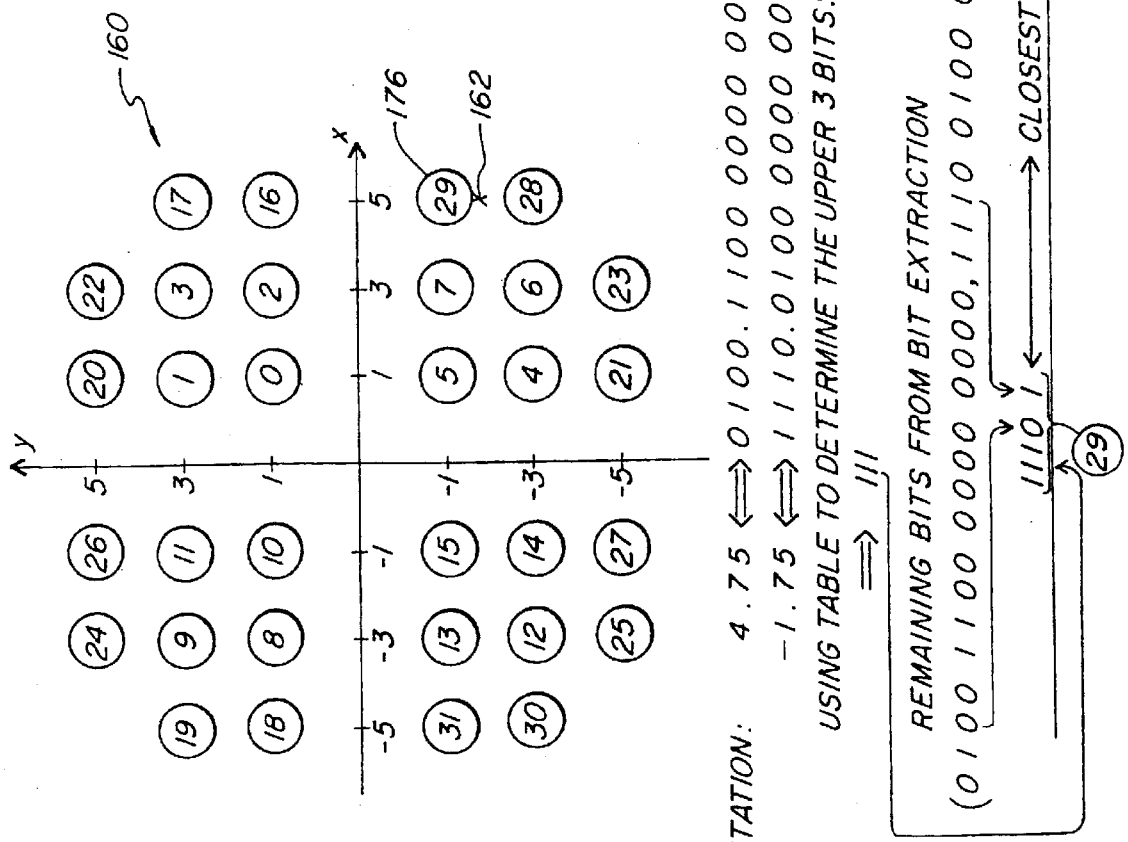
FIG. 12 illustrates a table that describes how sign bits in x and y coordinates are related to the upper five bits of the symbol.

Referring to FIG. 4, once each of the coset points is located in the shaded decode region 78 (FIG. 6), the bit extraction step 112 is performed to identify the nearest neighbor for each coset. For example, referring to FIG. 11 that illustrates a five bit constellation 160, if one of the imaged points is located at location (4.75, −1.75) 162, the closest point is identified using Table 15 of the T1.413 Specification, which is reproduced as FIG. 12 herein. Based upon the binary representations of the location (4.75, −1.75) shown in FIG. 11, the two most significant bits for the X index are 01 binary, and the two most significant bits for the Y index are 11 binary. Referring to the table in FIG. 12, looking up 01 binary and 11 binary in columns 166, 168, respectively, indicates matches at rows 170 and 172 of the table. Referring to column 174 of the table, the upper three bits that define the closest coset point are 111 binary. The lower two bits that define the closest coset point are determined by bit extraction as shown in FIG. 11 as 01 binary. Combining the five bits yields 11101 binary as the closest coset point, which corresponds to constellation point twenty-nine 176 as shown in FIG. 11.

Figure 10:
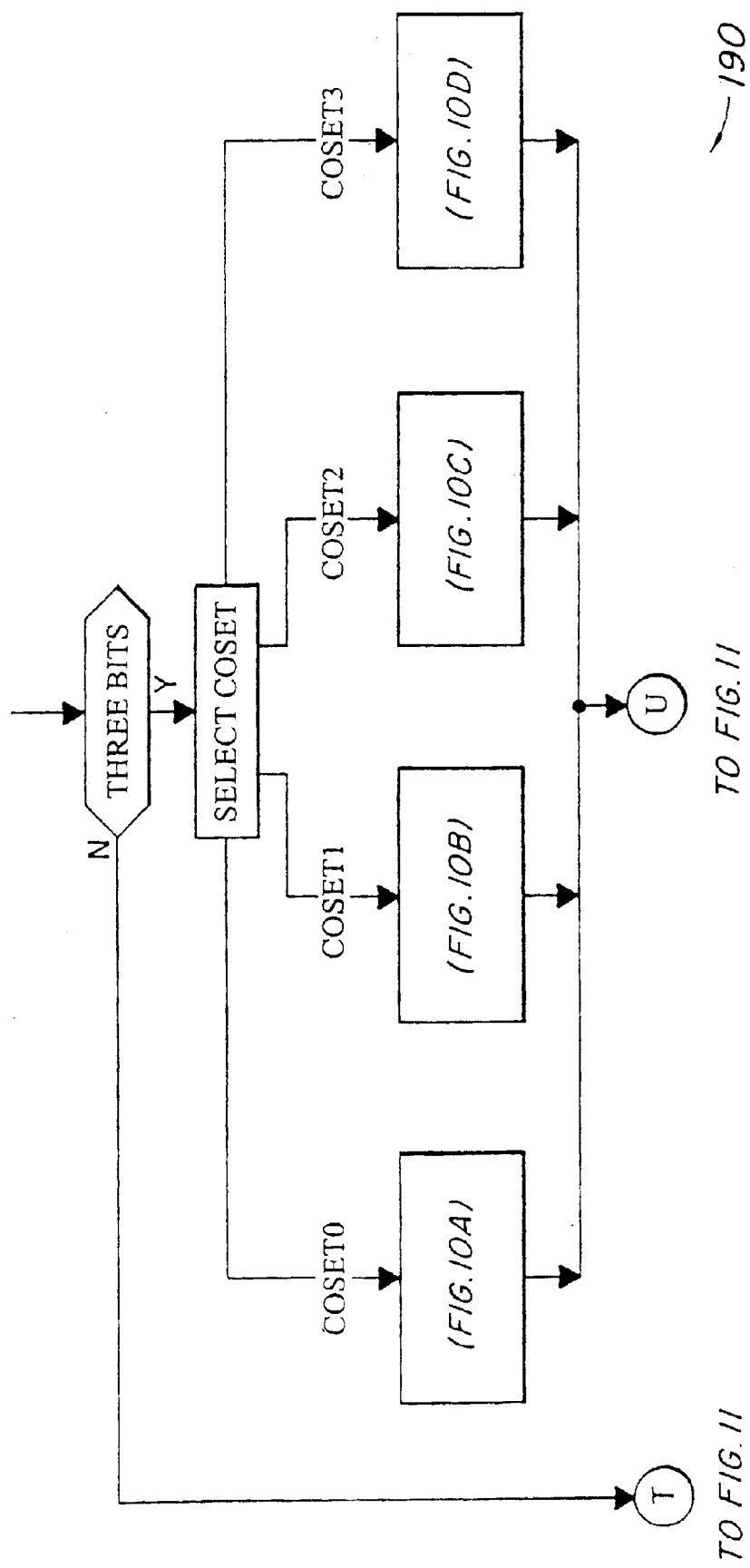
FIGS. 10A–10B together illustrate steps for determining the nearest neighbor from each coset for the translated/imaged points.

Referring yet again to FIG. 4, if the number of bits that define the constellation are either three or five, then step 190 determines the nearest constellation point from each coset using the direct mappings illustrated in FIGS. 10A–10B.

Although the present invention has been shown and described with respect to several preferred embodiments thereof, various changes, omissions and additions to the form and detail thereof, may be made therein, without departing from the spirit and scope of the invention.

What is claimed is:

1. A method of identifying the closest points from each coset in a four-dimensional trellis decoder, the method comprising the steps of:

reading a received point $(X_n, Y_n)$;

determining boundary values for a signal constellation based upon the number of bits of information that define the received point;

translating the received point $(X_n, Y_n)$ in at least four directions to provide at least four translated/image points;

for each of the imaged points that said step of translating causes to transition outside a decode region of the signal constellation, mapping the imaged point into the decode region to ensure each of the imaged points lies within the decode region; and for each of the four cosets, performing bit extraction on the associated imaged point to identify the closest coset point to the received point.

2. The method of claim 1, wherein said step of translating comprises the steps of:

defining a first imaged point $(X_n+1, Y_n+1)$;

defining a second imaged point $(X_n-1, Y_n+1)$;

defining a third imaged point $(X_n-1, Y_n-1)$; and defining a fourth imaged point $(X_n+1, Y_n-1)$.

3. The method of claim 1, wherein said step of translating comprises the steps of:

checking the number of bits of information that define the received point to determine if the number of bits is an odd number greater than five, and if it is, pushing each of the imaged points that lie outside the decode region into the decode region.

4. The method of claim 1, wherein said step of translating comprises the steps of:

initially defining a first imaged point $(X_n+1, Y_n+1)$;

initially defining a second imaged point $(X_n-1, Y_n+1)$;

initially defining a third imaged point $(X_n-1, Y_n-1)$;

initially defining a fourth imaged point $(X_n+1, Y_n-1)$;

determining if any of the coordinate values for either said first, second, third or fourth imaged points changed sign in comparison to the received point; and setting the coordinate value of a imaged point that did change sign in comparison to the received point, equal to the coordinate value of the received point.

5. The method of claim 4, wherein said step of determining includes the step of checking a sign bit for each coordinate value of said first, second, third and fourth imaged points.

6. The method of claim 5, wherein said step of translating further comprises the steps of:

checking the number of bits of information that define the received point to determine if the number of bits is an odd number greater than five, and if it is, comparing said imaged points that lie in a corner region of the signal constellation to determine if any of the imaged points lie on the opposite side of a line through the corner region defined by the absolute value of $Y_n$ equal to the absolute value of $X_n$.

7. An apparatus for identifying the closest points from each coset in a four-dimensional trellis decoder, comprising:

a buffer that receives a received point $(X_n, Y_n)$;

means for determining boundary values for a signal constellation based upon the number of bits of information that define said received point;

means for translating said received point in four directions to provide four translated image points;

means for mapping the imaged point into the decode region to ensure each of the imaged points lies within the decode region; and means for performing bit extraction on the imaged points to identify the closest coset points to the received point.

8. The apparatus of claim 7, wherein said apparatus is embodied in a finite-state machine resident on an integrated circuit.

* * * * *